United States Patent
Zhu et al.

(10) Patent No.: US 7,858,485 B2
(45) Date of Patent: Dec. 28, 2010

(54) STRUCTURE AND METHOD FOR MANUFACTURING TRENCH CAPACITANCE

(75) Inventors: Huilong Zhu, Poughkeepsie, NY (US); Babar A. Khan, Ossining, NY (US); Xi Li, Somers, NY (US); Joyce C. Liu, Carmel, NY (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/191,430

(22) Filed: Aug. 14, 2008

(65) Prior Publication Data
US 2010/0038751 A1    Feb. 18, 2010

(51) Int. Cl.
*H01L 21/20* (2006.01)
(52) U.S. Cl. .................................. 438/391; 438/386
(58) Field of Classification Search .................. 438/257, 438/386, 391
See application file for complete search history.

(56) References Cited

U.S. PATENT DOCUMENTS

| | | | |
|---|---|---|---|
| 6,008,104 A | 12/1999 | Schrems | |
| 6,281,069 B1 | 8/2001 | Wu et al. | |
| 6,355,518 B1 * | 3/2002 | Wu et al. | 438/246 |
| 6,509,599 B1 | 1/2003 | Wurster et al. | |
| 6,841,443 B2 | 1/2005 | Temmler et al. | |
| 7,256,439 B2 * | 8/2007 | Cheng et al. | 257/301 |
| 2001/0038112 A1 * | 11/2001 | Gambino et al. | 257/301 |
| 2005/0127422 A1 * | 6/2005 | Hsiao et al. | 257/301 |
| 2007/0235792 A1 * | 10/2007 | Kwon et al. | 257/314 |

* cited by examiner

*Primary Examiner*—Bradley K Smith
(74) *Attorney, Agent, or Firm*—Howard M. Cohn; H. Daniel Schnurmann

(57) ABSTRACT

A deep trench (DT) capacitor comprises a trench in a silicon layer, a buried plate surrounding the trench, a dielectric layer lining the trench, and a node conductor in the trench. The top surface of the poly node is higher than the surface of the silicon layer, so that it is high enough to ensure that a nitride liner used as a CMP etch stop for STI oxide surrounding a top portion of the poly node will be higher than the STI oxide, so that the nitride liner can be removed prior to forming a silicide contact on top of the poly node.

9 Claims, 8 Drawing Sheets

STRUCTURE AND METHOD FOR MANUFACTURING TRENCH CAPACITANCE

FIELD OF THE INVENTION

The invention relates to semiconductor fabrication and, more particularly, to forming trench capacitors, such as deep trench (DT) capacitors.

BACKGROUND OF THE INVENTION

Semiconductor devices are electronic components that exploit the electronic properties of semiconductor materials, principally silicon, germanium, and gallium arsenide. Semiconductor devices are manufactured both as single discrete devices and as integrated circuits (ICs), which consist of a number—from a few to millions—of devices manufactured and interconnected on a single semiconductor substrate. Semiconductor ICs are generally fabricated in a layer process which may include the main process steps of imaging, deposition and etching. The main process steps may be supplemented by doping, cleaning and planarization steps. A semiconductor IC may comprise both "active" devices such as transistors, and "passive" devices such as capacitors.

Capacitors are often formed in semiconductor devices and may be used, for example, in conjunction with an access transistor in a dynamic random access memory (DRAM) cell, or in conjunction with a power supply. A capacitor typically comprises two electrically-conductive plates (or structures) separated from one another by a dielectric (electrically insulating) layer (or space).

Trenches are often formed in semiconductor devices, and are often characterized as "shallow" or "deep". A shallow trench may have a depth "d" of 200-300 nm, a width of at least 100 nm (can be as wide as desired), resulting in an aspect ratio (d:w) of approximately at most 3:1, more typically 2:1 or lower, such as 1:1. A typical use for a shallow trench is filling with oxide to isolate devices from one another. A deep trench may have a depth "D" of approximately 2000-10000 nm (2-5 microns), a width "W" of approximately 50-500 nm, is much deeper than it is wide, having an aspect ratio (D:W) of approximately 40:1, including at least 10:1. A typical use for a deep trench is forming a capacitor such as for a DRAM cell.

Generally, a "trench capacitor" comprises:
- a trench (which may be a deep trench "DT") formed in a substrate (such as bulk silicon),
- a conductive plate formed in the substrate around the trench (sometimes referred to as "buried plate"),
- a dielectric insulator formed on the walls (and bottom) of the trench, and
- a conductor such as heavily-doped polysilicon filling the trench (sometimes referred to as "node conductor", or "poly node")

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

capacitor A capacitor is a two-terminal device (electrical or electronic component) that can store energy in the electric field between a pair of conductive electrodes (called "plates"). The process of storing energy in the capacitor is known as "charging", and involves electric charges of equal magnitude, but opposite polarity, building up on each plate.

CMP short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or levelled) out, prior to performing a subsequent process step. Generally, CMP will level out the high spots, leaving a relatively smooth planar surface.

dielectric A dielectric is a non-conducting material or substance. (A dielectric is an electrical insulator.) Some dielectrics commonly used in semiconductor technology are SiO2 ("oxide") and Si3N4 ("nitride"). The insulating quality of a dielectric may be characterized by "k", the dielectric constant. Generally, the higher the "k", the better the insulating quality of the dielectric. Oxide, for example, has a k of approximately 3.9. A class of materials, referred to as "high-k" (or "high-K") dielectrics, have a dielectric constant higher than that of oxide (k>3.9).

etching etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch.

Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically.

Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

mask The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask".

plasma etching Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping.

resist short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material.

RIE short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface—in other words, etching is more anisotropic than in plasma etching but is less selective. RIE typically leaves the etched surface damaged. RIE is the most common etching mode in semiconductor manufacturing.

STI short for shallow trench isolation. Generally, a trench etched into the substrate and filled with an insulating material such as oxide, to isolate one region of the substrate from an adjacent region of the substrate. One or more transistors of a given polarity may be disposed within an area isolated by STI.

SUMMARY OF THE INVENTION

A technique is disclosed for forming deep trench (DT) capacitors in semiconductor substrates, such as bulk silicon or the silicon layer of a SOI (silicon on insulator) substrate.

Generally, the top surface of the poly node of a DT capacitor is high enough to ensure that a nitride liner used as a CMP etch stop for STI surrounding a top portion of the poly node will be higher than the STI, so that the nitride liner can be removed prior to forming a silicide contact on top of the poly node.

According to an embodiment of the invention, a method of forming a trench capacitor comprises: forming a trench in a silicon layer; forming a buried plate surrounding the trench; providing a dielectric layer lining the trench; providing a node conductor in the trench; and surrounding a top portion of the node conductor with STI oxide; wherein, a top surface of the node conductor extends higher than a top surface of the surrounding STI oxide. The top surface of the node conductor may be 300-800 Å higher than a top surface of the silicon layer. The silicon layer may comprise bulk silicon, or it may comprise a silicon layer of a silicon on insulator (SOI) substrate. A nitride liner may be disposed atop the node conductor, serving as a CMP etch stop (and eventually will be removed).

According to an embodiment of the invention, a trench capacitor comprises: a trench in a silicon layer; a buried plate surrounding the trench; a dielectric layer lining the trench; and a node conductor in the trench; wherein, a top surface of the node conductor extends higher than a top surface of the silicon layer. The top surface of the node conductor may be 300-800 Å higher than a top surface of the silicon layer. The silicon layer may comprise bulk silicon, or it may comprise a silicon layer of a silicon on insulator (SOI) substrate. The trench may be a deep trench (DT) having a depth of approximately 3 µm-7 µm and a width of approximately 300 nm. The deep trench (DT) may be at least 10 times deeper, than it is wide. STI oxide may surround a top portion of the node conductor; wherein: a top surface of the node conductor is high enough to ensure that a nitride liner used as a CMP etch stop will be higher than the STI oxide.

According to an embodiment of the invention, a method of forming a trench capacitor comprising: providing a silicon layer; providing an oxide layer on the silicon layer; providing a nitride layer on the first oxide layer; forming a deep trench extending through the nitride layer, through the first oxide layer, and into the silicon layer; providing a buried plate (BP) surrounding the deep trench; providing a dielectric material lining sidewalls and a bottom surface of the deep trench; depositing a conductive poly node in the trench; wherein, a top portion of the conductive poly node is etched back after deposition to be above a top surface of the silicon layer and below a top surface of the first nitride layer. The nitride layer may have a thickness of 80-150 nm. The trench may be formed by reactive ion etching (RIE). The top surface of the poly node may be 300-800 Å, such as 500 Å higher than the top surface of the silicon layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Figure 1A:
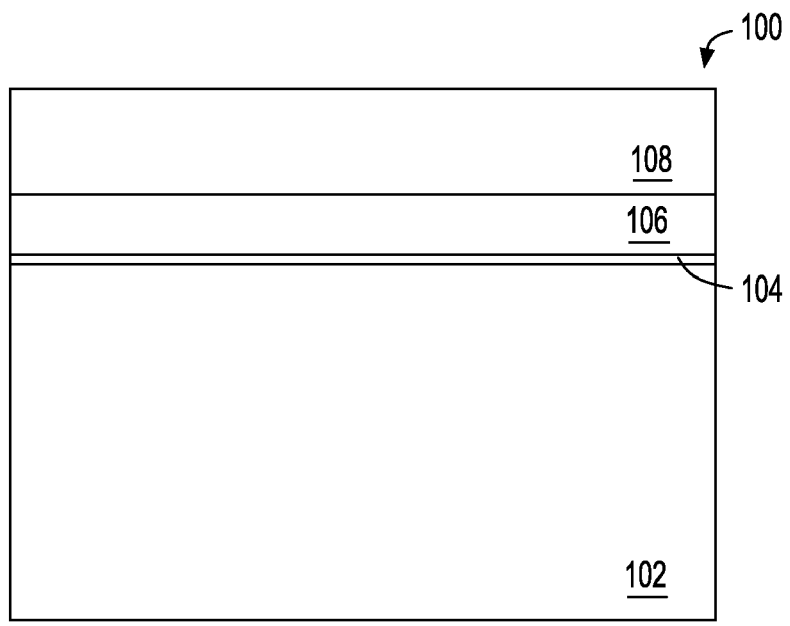

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that they may not be so straight, and the intersections may be rounded, due to the nature of the processes (such as etching) used to form the various elements of the semiconductor devices.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

In the drawings accompanying the description that follows, both reference numerals and legends (labels, text descriptions) may be used to identify elements. If legends are provided, they are intended merely as an aid to the reader, and should not in any way be interpreted as limiting.

Figure 1B:
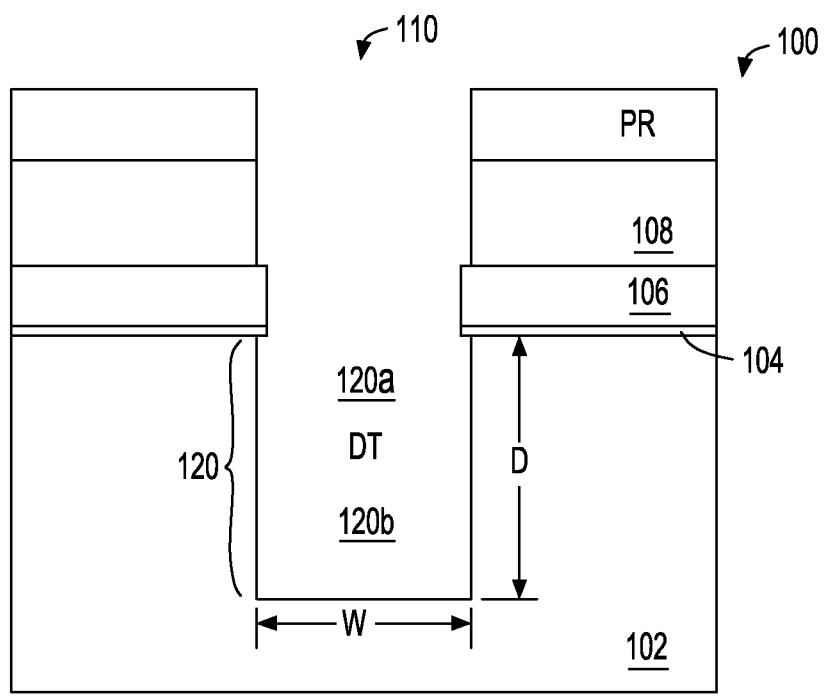
Figure 1C:
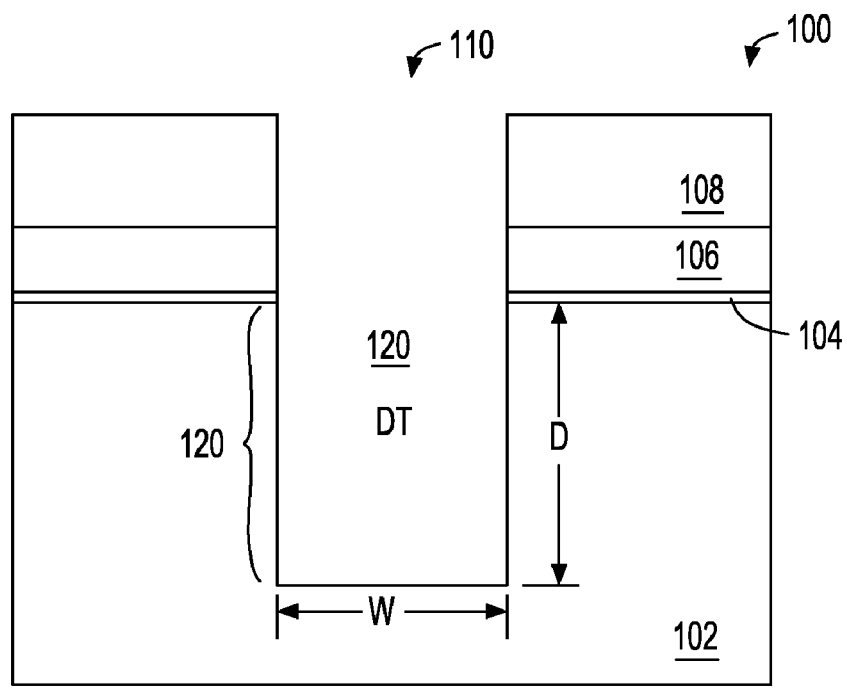
Figure 1D:
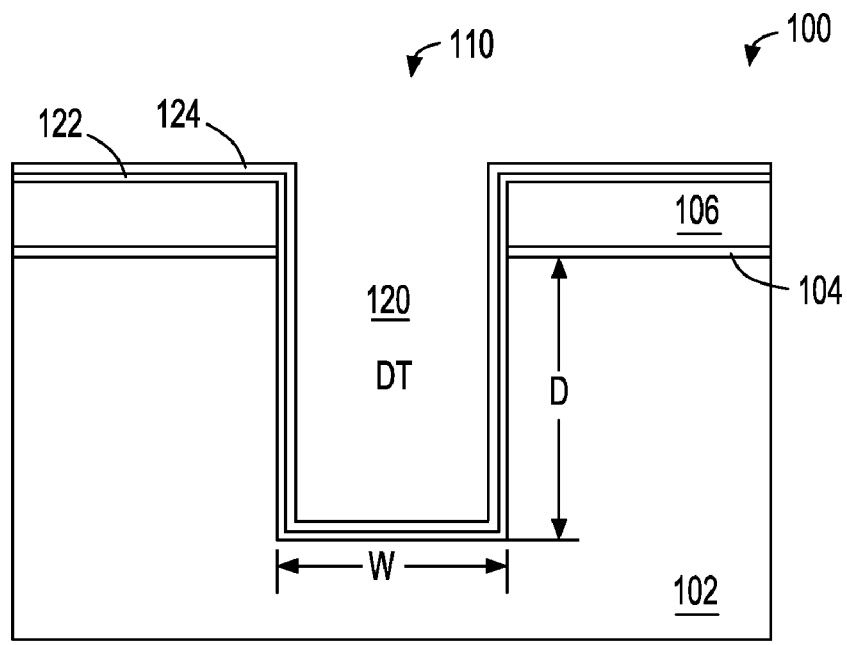
Figure 1E:
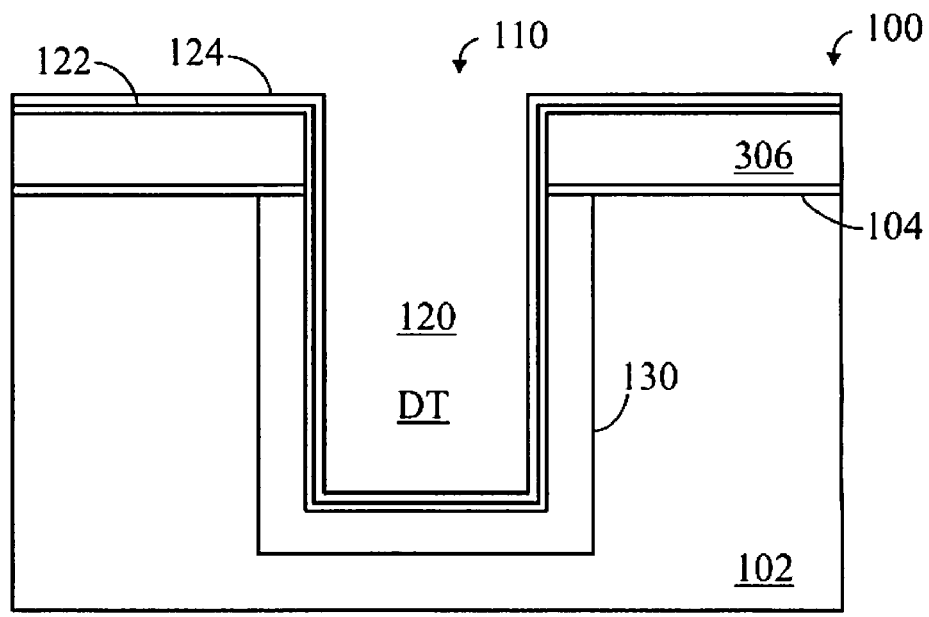
Figure 1F:
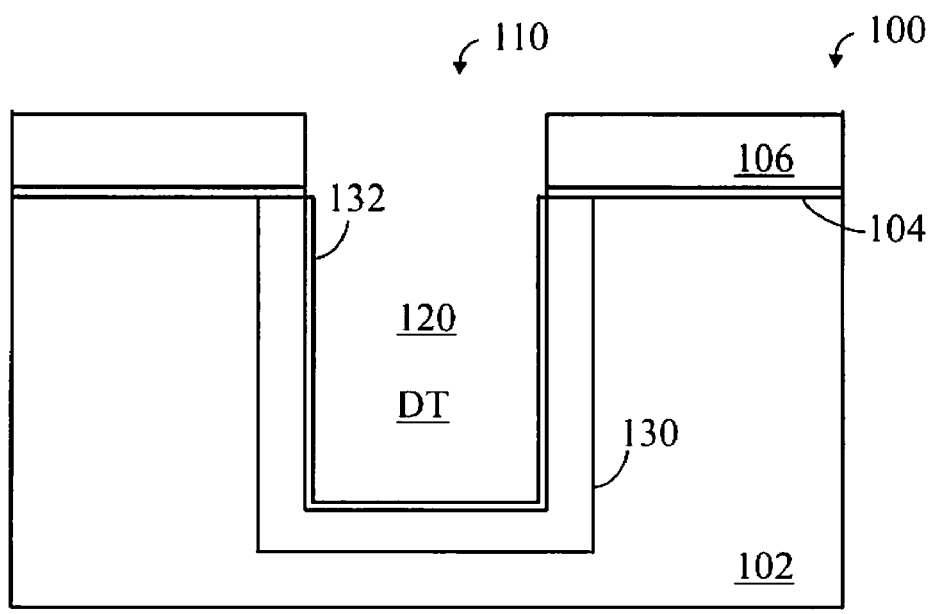
Figure 1G:
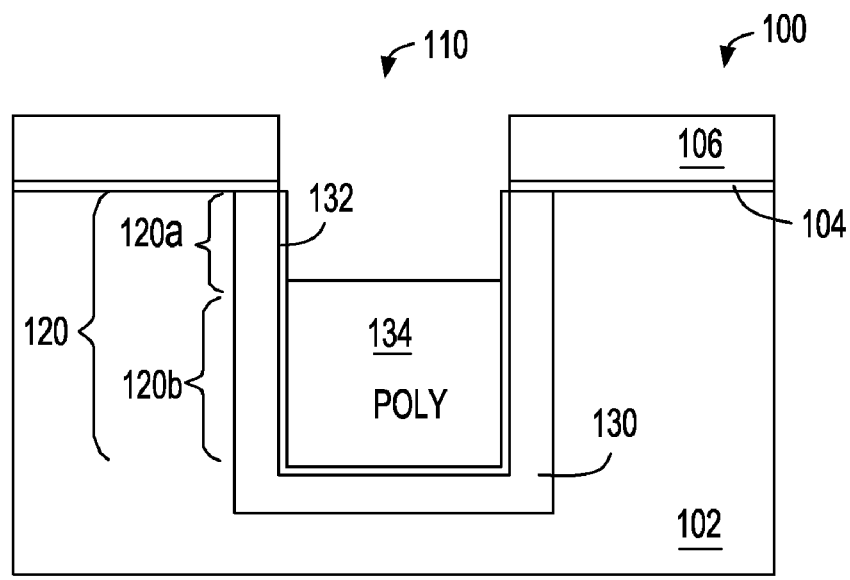
Figure 1H:
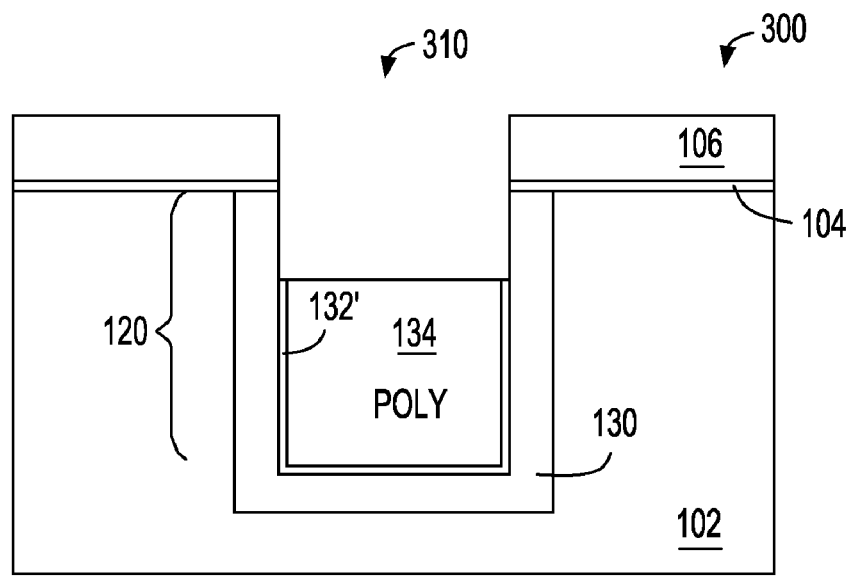
Figure 1I:
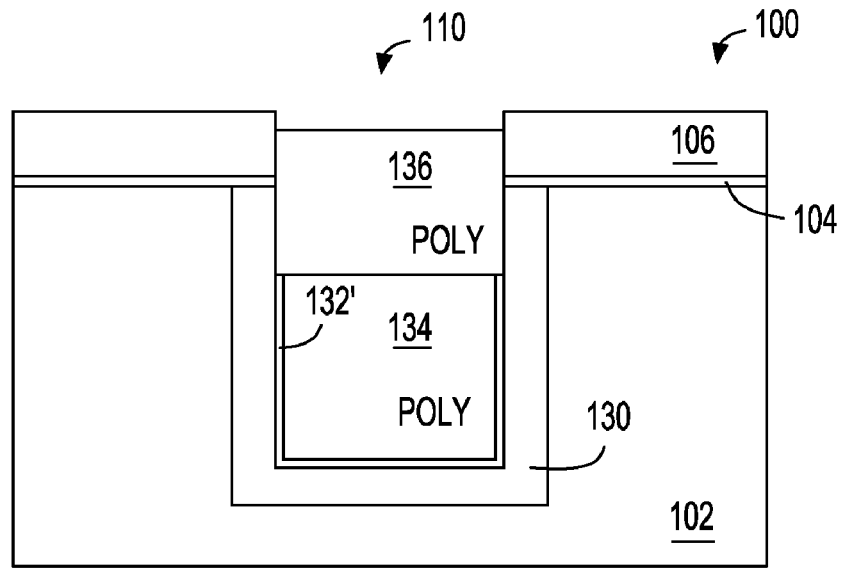
Figure 1J:
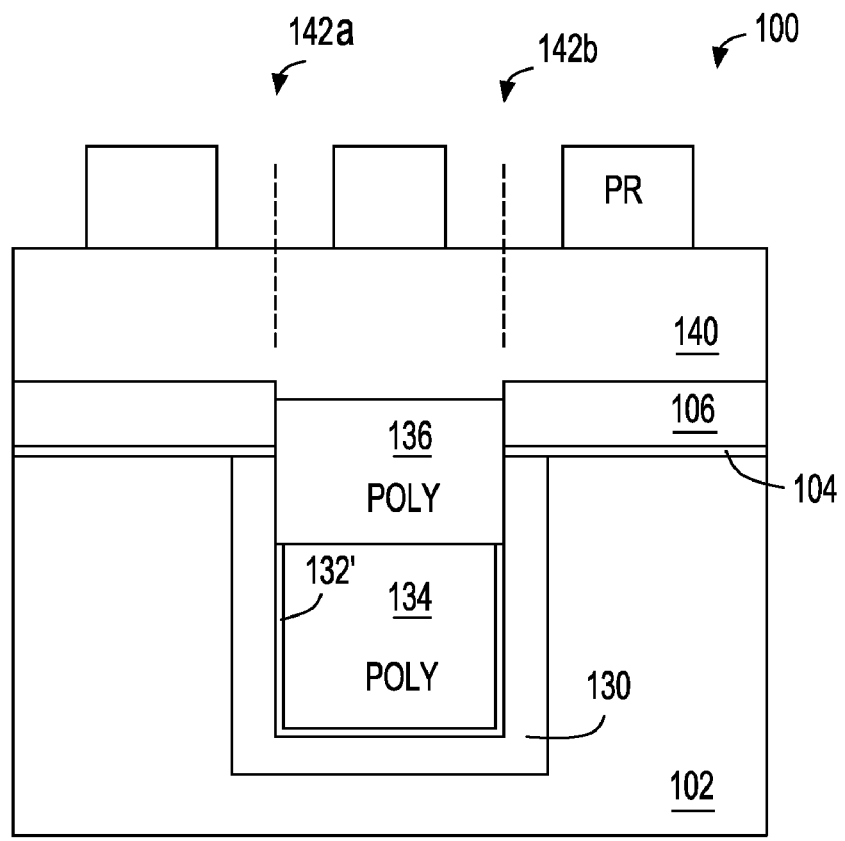
Figure 1K:
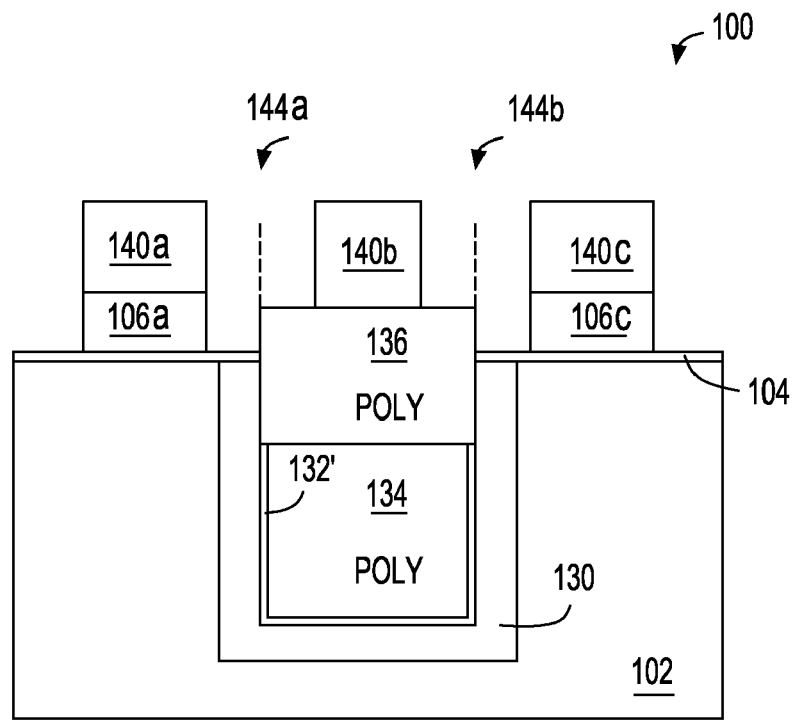
Figure 1L:
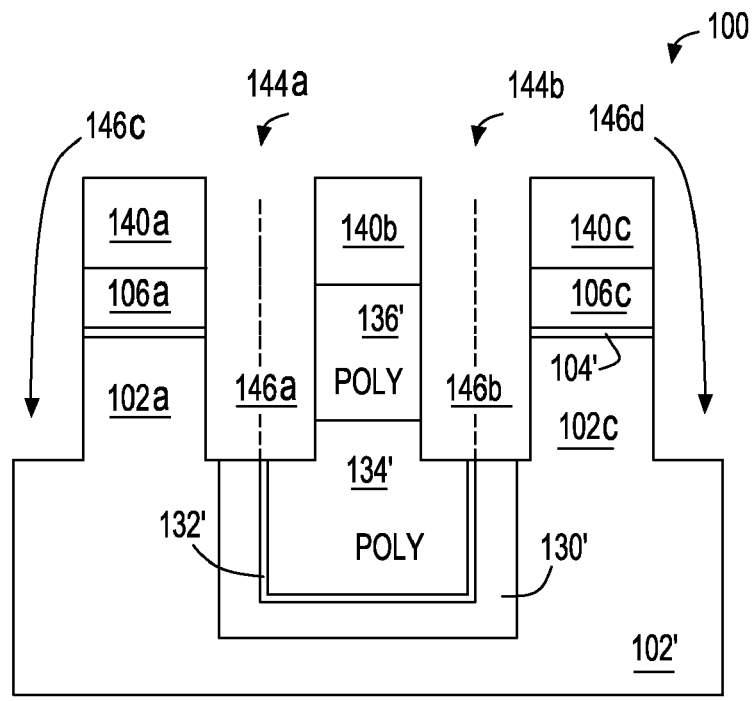
Figure 1M:
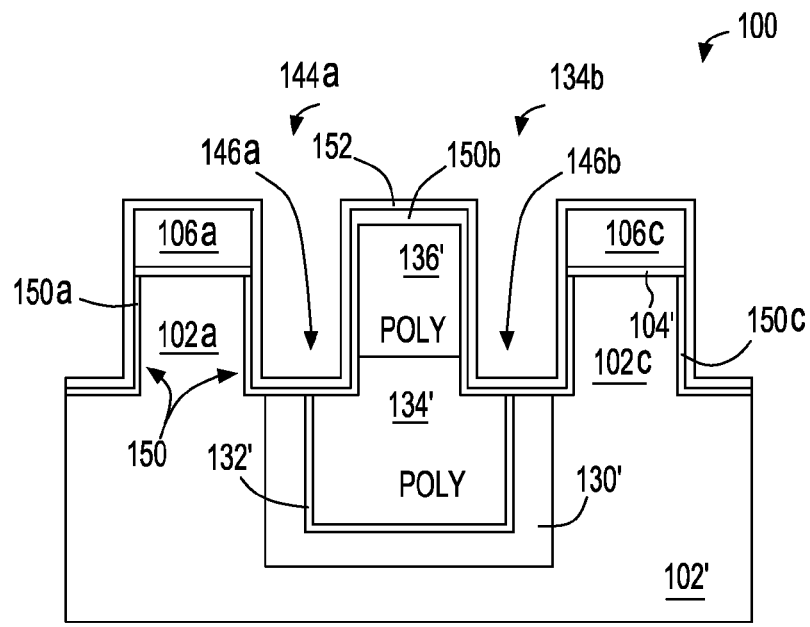
Figure 1N:
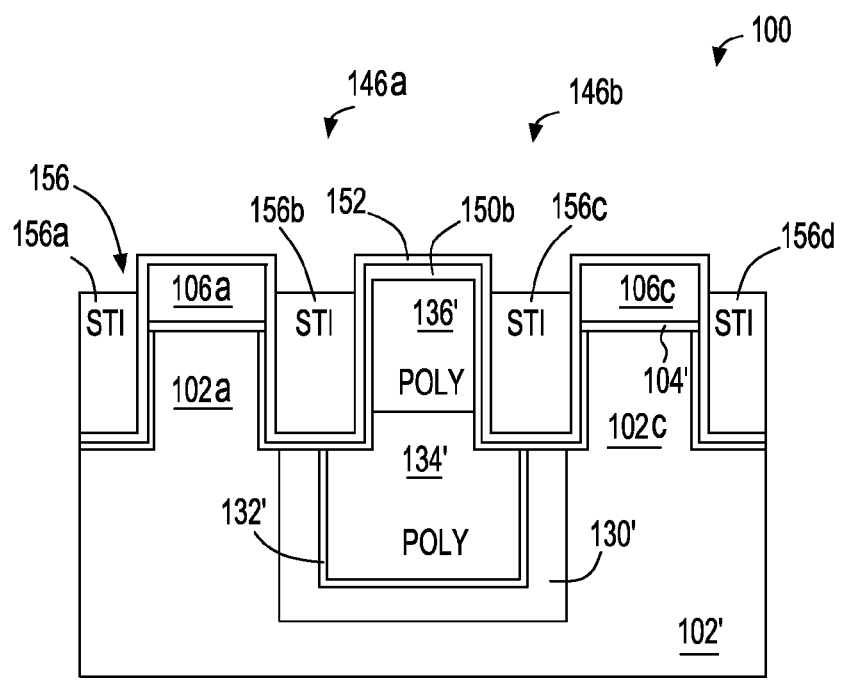
Figure 1O:
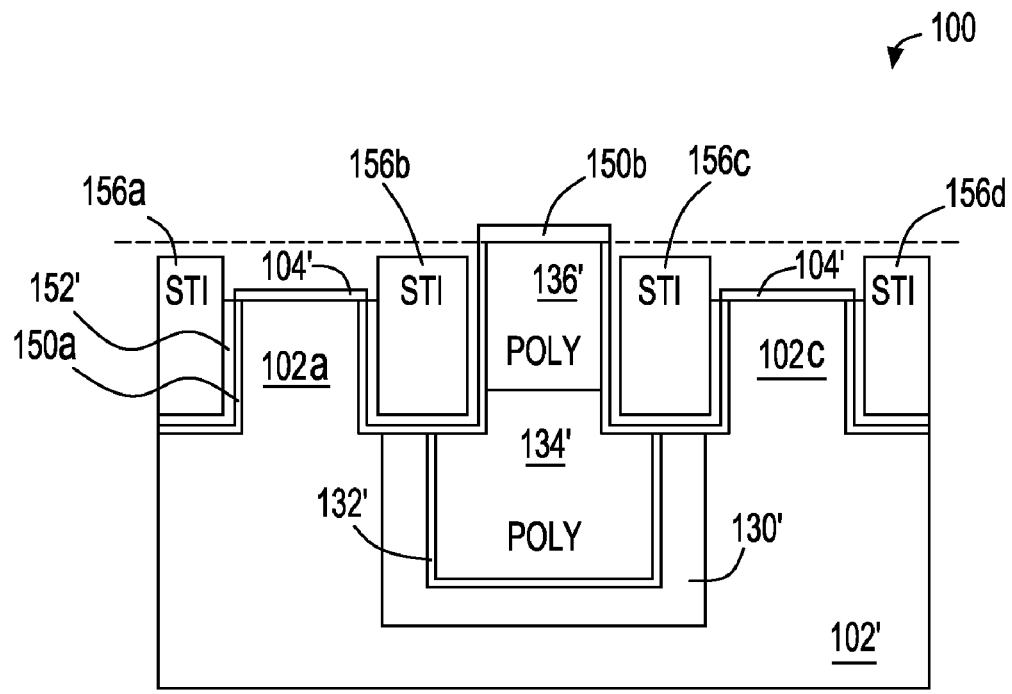
Figure 1P:
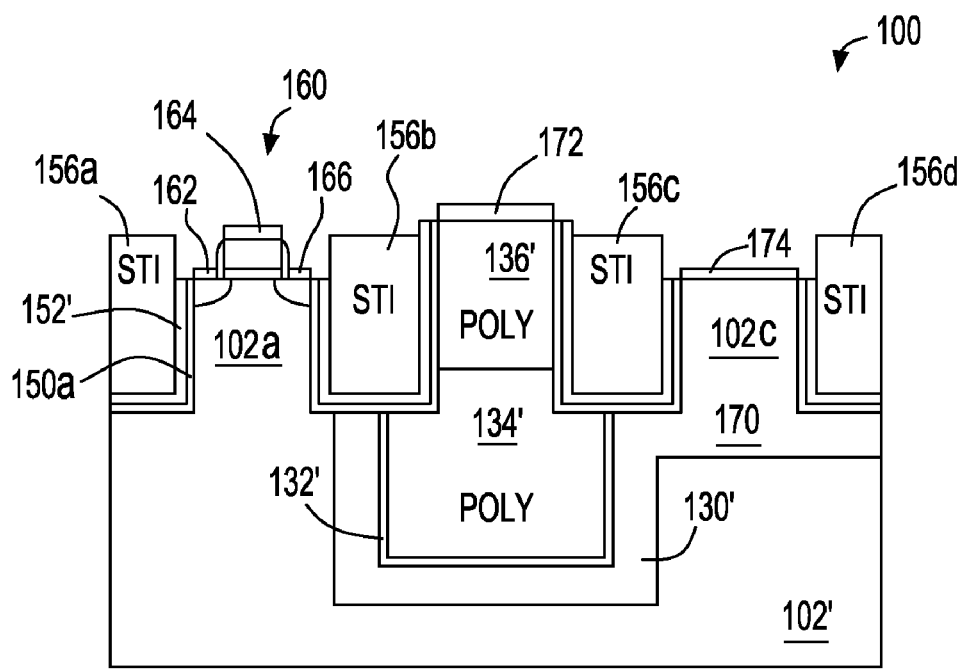

FIGS. 1A-1P are cross-sectional views of a sequence of steps in a process of forming a trench capacitor, according to an embodiment of the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith.

As used herein, the term semiconductor fabrication or process or device may refer to standard CMOS processing and devices. CMOS is a widely used type of semiconductor product that uses both NMOS (negative polarity) and PMOS (positive polarity) devices and circuits. Generally, unless otherwise stated, the polarities of any device disclosed herein may be reversed, "p" for "n", which may (or may not) require that other associated devices are also implemented with opposite polarity.

An exemplary process will be described for forming a trench capacitor (manufacturing trench capacitance) in a semiconductor substrate, using a sequence of process steps.

FIGS. 1A-1P illustrate a sequence of steps in an embodiment of an overall method for manufacturing trench capacitance, and a resulting structure (or product) resulting there from. Each figure may illustrate one or more steps, and in each figure an "interim" product may be illustrated.

FIG. 1A illustrates a first step (bulk wafer) of the process 100. Beginning with a substrate having a silicon layer 102 (which may be a bulk silicon substrate or a silicon layer on an SOI substrate), a thin layer 104 of oxide may be formed (such as grown or deposited), followed by a layer 106 of nitride, followed by a layer 108 of oxide. The following dimensions are exemplary:

the oxide layer 104 may have a thickness of 3-10 nm, such as approximately 5 nm the nitride layer 106 may have a thickness of 80-150 nm, such as approximately 100 nm the oxide layer 108 may have a thickness of 800-1500 nm, such as approximately 1000 nm FIG. 1B illustrates a next step (deep trench) of the process. Photoresist (or simply "resist", PR) is applied over the oxide 108 and is patterned, leaving an opening 110 where (underneath which) a trench 120 extending into the silicon layer 102 will be formed.

An opening through the top oxide layer 108 may be etched, using reactive ion etching (RIE). An opening through the nitride layer 106 may also be etched, using RIE. An opening through the bottom oxide layer 104 may also be etched, using RIE. This may be an integrated RIE step.

Note that the nitride layer 106 and underlying oxide layer 104 are sticking out into the opening 110, having been etched less than either the top oxide layer 108 or the deep trench (DT) 120.

The resist PR may then be removed, and another RIE performed to form the deep trench (DT) 120 in the silicon layer 102. The deep trench (DT) may have a depth D of approximately 3 µm-7 µm (3000-7000 nm), and a width W of approximately 300 nm (0.30 µm). The trench 120 is thus much deeper, such as at least 10 times deeper, than it is wide.

The deep trench 120 has a top (upper) portion 120a and a bottom (lower) portion 120b. The top portion 120a may constitute approximately the upper one-third (such as 2 µm) of the trench 120, with the bottom portion 120b constituting the remaining approximately two-thirds (such as 4 µm) of the trench 120.

Generally, a capacitor will be formed in the lower portion 120b of the deep trench 120, comprising a buried plate (BP) surrounding the trench 120, a thin dielectric material lining the sidewalls and bottom surface of the trench 120, and a conductive poly node deposited in the trench, as described hereinbelow.

FIG. 1C illustrates a next step (etch back nitride) of the process. The nitride layer 106 and underlying oxide layer 104 are etched back, using RIE. This eliminates that part of the nitride layer 106 that was sticking out into the opening 110 above the trench 120 in the previous step.

FIG. 1D illustrates a next step (Deposit ASG) of the process. First, the top oxide 108 is removed, using wet etch.

Next, a thin layer 122 of ASG (Arsenic-doped Glass/oxide) is deposited to cover the sidewalls and bottom surface of the trench 120. The ASG layer 122 may also cover the exposed surfaces of the nitride 106. Generally, the ASG covers all exposed surfaces, substantially evenly. The ASG layer 122 may have a thickness of approximately 27 nm.

Then, a layer 124 of low temperature oxide (LTO) is deposited. The LTO layer 124 covers the ASG 122 on the sidewalls and bottom surface of the trench 120, and may also cover the ASG 122 which is on the nitride 106. Generally, the oxide covers all exposed surfaces, substantially evenly. The LTO layer 124 may have a thickness of approximately 40 nm.

FIG. 1E illustrates a next step (Anneal) of the process. An anneal is performed, such as at 1050° C. for 20 minutes to drive the arsenic (As) from the ASG 122 into the silicon 102. This results in an arsenic-doped buried plate 130 surrounding the trench 120. (Some arsenic may also incidentally be driven into the nitride 106, and oxide 104.)

FIG. 1F illustrates a next step (etch oxide and ASG; nitridation and re-oxidation) of the process. First, the oxide 124 and ASG 122 are removed, using a wet etch, such as hydrofluoric acid (HF).

Next, a layer 132 of oxided nitride is deposited to cover the sidewalls and bottom surface of the trench 120, for capacitance dielectric (dielectric layer for the deep trench capacitor being formed). The layer 132 may have a thickness of 3-10 nm.

As deposited, the oxided nitride 132 may also cover the exposed surfaces of the nitride 106 (not shown). Generally, the oxided nitride 132 covers all exposed surfaces, substantially evenly. After oxidation, the thickness of the nitride 132 grows on the Si sidewall (and bottom) of the trench 120, and will thus be thicker than on other exposed surfaces. The layer 132 of oxided nitride is formed by first depositing a layer of nitride, then performing an oxidizing step. Generally, nitride can get oxide and oxygen can diffuse through the nitride layer to form oxide between Si and nitride, which is why the layer 132 is thicker on the Si sidewall (and bottom) of the trench 120.) In FIG. 1F, this is indicated by showing the layer 132 only in the trench 120 (which is silicon), and not on the nitride 106.

FIG. 1G illustrates a next step (Deposit and etch back Poly) of the process. Arsenic-doped polysilicon (poly-Si) 134 is deposited into the deep trench 120, filling it, and is then etched back to be below the top surface of the substrate 102 (or, below the oxide 104 which is on the surface of the silicon substrate 102). For example, 70-300 nm, such as approximately 250 nm below the top surface of the substrate 102.

At this stage of the overall process, there is As-doped poly-Si 134 in the bottom portion 120b of the trench 120, surrounded by oxided nitride 132, and a buried plate 130 surrounds at least the bottom portion 120b of the trench 120. A deep trench (DT) capacitor has been formed, comprising (in generic terms):
  an outer electrode or "buried plate" 130
  a dielectric layer 132
  an inner electrode, or "node conductor" 134

FIG. 1H illustrates a next step (etch oxided nitride) of the process. In this step, a portion of the oxided nitride 132 which is above the poly-Si 134 is removed, using a wet etch (HF/EG or hydrofluoric acid/ethylenglykol). Thus, the remaining oxided nitride is labeled 132' (prime).

FIG. 1I illustrates a next step (deposit poly-Si) of the process. The top portion 120a of the trench 120 is filled up with As-doped poly-Si 136, which may then be etched back so that the top of the poly-Si 136 is below the top surface of the nitride 106, but above the bottom surface thereof (e.g., above the top surface of the substrate 102). (Recall that in the previous step the top portion 120b of the trench 120 was stripped of oxided nitride 132.)

The second poly-Si 136 which is atop the first poly-Si 134 will eventually serve as a contact to the first poly 134 (inner conductor of the capacitor). The second poly-Si 136 may also be considered to simply be an extension of (or part of) the node conductor 134. A contact to the buried plate 130 (outer conductor of the capacitor) will also be described hereinbelow.

At this stage of the overall process, there is As-doped poly-Si 134 (step shown in FIG. 1G) in the bottom portion 120b of the trench 120, surrounded by oxided nitride 132, and there is As-doped poly-Si 136 in the top portion of the trench 120.

The bottom portion 120b of the trench 120 is lined (walls and bottom) with an insulating material (oxided nitride 132'), and a buried plate 130 surrounds at least the bottom portion 120b of the trench 120. Between the steps illustrated in FIGS. 1G and 1I, the oxided nitride 132 has been removed from the walls of the top portion 120a of the trench 120, and a "conductive plug" (the As-doped poly-Si) 136 has been formed atop the "node conductor" 134.

Note, at this stage of the process, the node conductor (or contact) 136 is touching the buried plate 130 at the top portion 120a of the trench 120, which would "short out" the capacitor. This situation will be remedied in a subsequent step (STI trench formation, FIG. 1L).

As a result of this step,
  a top surface of the poly-Si contact 136 is higher than the top surface of the silicon 102, for example 300-800 Å higher, such as 500 Å higher
  the top surface of the nitride 106 is higher than the top surface of the poly-Si 136

It is significant that the poly-Si 136 is higher than the top surface of the silicon 102. Later on in the process, a nitride liner (152, FIG. 1M, used as a CMP etch stop) will be formed and, as will become evident, if the poly-Si 136 were not higher than the top surface of the silicon 302, later on in the process, the nitride liner (152) on the top of poly-Si (136) may bury in STI oxide (156, FIG. 1N). In such a case, the nitride liner on top of the poly-Si could not be removed, and could therefore prevent forming of silicide contact on the top of poly-Si or increase contact resistance.

FIG. 1J illustrates a next step (Deposit Oxide) of the process. A layer 140 of oxide is deposited, having a thickness of 50-200 nm. Photoresist (PR) is applied, and is patterned to have two openings 142a and 142b. These openings 142a and 142b will be for forming STI trenches, in a subsequent step, and are located on either side (as viewed) of the trench 120, generally directly above the sidewalls of the trench 120 (as indicated by the dashed lines). The openings 142a and 142b may each have a width of 50-120 nm.

These figures being cross-sectional views, in actuality, the two openings 142a and 142b are simply opposite sides of a single ring-shaped opening (not necessarily circular), having a width of 50-120 nm, which encircles the trench 120 and has an inner diameter (or cross-dimension, if not circular) comparable to the cross-dimension of the trench 120.

FIG. 1K illustrates a next step (RIE Oxide) of the process. Openings 144a and 144b may be etched through the oxide layer 140, resulting in "islands" 140a, 140b and 140c of oxide. (The openings 144a and 144b are directly under the openings 142a and 142b in the photoresist, FIG. 1J.) The oxide etch may be reactive ion etching (RIE). The openings 144*a* and 144*b* may each have a width of 45-110 nm.

Then the resist (PR) may be removed. The oxide islands 140*a*, 140*b* and 140*c* may serve as a hard mask for subsequent nitride and Si trench RIE.

Then, a second RIE of nitride 106, selective to oxide, may be performed to extend the openings 144*a* and 144*b* through the nitride 106, resulting in "islands" 106*a* and 106*c* of nitride directly below the islands 140*a* and 140*c* of oxide.

The openings 144*a* and 144*b* through the oxide 140 and the nitride 106 are generally directly above the sidewalls of the trench 120 (as indicated by the dashed lines), and may be opposite sides of a single ring-shaped opening which encircles the trench 120.

FIG. 1L illustrates a next step (RIE Si) of the process. RIE may be performed to form openings 146*a*, 146*b*, 146*c* and 146*d* (collectively referred to as "146") in the silicon 102' (prime). This results (among other things) in there being two islands 102*a* and 102*c* of silicon, one of which may be used as an active area for forming a FET, as discussed hereinbelow. The original oxide 104' (prime) has also been modified by the openings 146.

Note that the openings 146*a* and 146*b* are essentially extensions of the openings 144*a* and 144*b*, are generally directly above the sidewalls of the trench 120 (as indicated by the dashed lines), and may be opposite sides of a single ring-shaped opening which encircles the trench 120. These openings 146*a* and 146*b* will be filled with oxide, and may be referred to as shallow trench isolation (STI) trenches. (The openings 144*a* and 144*b* will also be filled with oxide.)

Note that these openings (STI trenches) 146*a* and 146*b* in the silicon 102' are generally directly below the corresponding openings 144*a* and 144*b* in the nitride 106, which may act as a hard mask.

Note that these openings (STI trenches) 146*a* and 146*b* in the silicon 102' extend past the top portion 120*a* of the deep trench 120 to the bottom portion 120*b* of the deep trench 120, modifying the node conductor 134' (prime). Now, the poly-Si contact 136 is no longer shorted to the buried plate 130 (compare FIG. 1I). Now there is a deep trench capacitor that is not shorted out.

Note that the poly contact 136' (prime) has been thinned. It has been encroached upon by the STI trenches 146*a* and 146*b*, and is thus thinner, having a width of 70-120 nm.

Note that the buried plate 130' (prime) has been encroached upon by the STI trenches 146*a* and 146*b*.

Note that the top of As-doped poly-Si contact 136' is above the top surface of the silicon 302', and is above the oxide 104'.

Note that the oxide 140 (140*a*, 140*b*, 140*c*) is still in place over the nitride 106*a*, 106*c* and the poly-Si contact 136'.

As will become evident, the top surface of the poly-Si contact 136' is high enough to ensure that the top of the nitride liner (152) is higher than the STI (156).

FIG. 1M illustrates a next step (etch oxide, form oxide liner, deposit nitride liner) of the process. First, the oxide 140 (140*a*, 140*b*, 140*c*) is removed, using a wet etch process.

Then, an oxide liner 150 is formed on all exposed silicon surfaces. This oxide liner 150 will not be formed on the exposed side and top surfaces of the nitride 106 (106*a*, 106*b*) or on the exposed side edges of the original thin oxide 104'. The oxide liner 150 may have a thickness of approximately from 5 to 20 nm.

More particularly, there are three portions 150*a*, 150*b*, 150*c* of the oxide liner 150. A first, L-shaped portion 150*a* covers a sidewall of the silicon island 102*a* distal (far from) the poly conductor 136'. A second, L-shaped portion 150*c* covers a sidewall of the silicon island 102*c* distal (far from) the poly conductor 136'. A third portion 150*b* covers sidewalls of the silicon islands 102*a* and 102*c* which are proximal (close to) the poly conductor 136', as well as covering the sidewalls and top surface of the poly conductor 136' itself. The oxide liner 150 ensures that there is no interface between the nitride liner 152 (next paragraph) and silicon.

Then, a nitride liner 152 is deposited on all exposed surfaces. More particularly, the nitride liner 152 covers the oxide liner 150, and the sides and top surfaces of the original nitride islands 106*a* and 106*b*, as illustrated. The nitride liner 152 may have a thickness of approximately from 5 to 20 nm.

An important feature of the invention is that the poly-Si node 136' in the trench capacitor extends higher than the STI (156, FIG. 1N) encircling it. More specifically, it is generally sufficient if the top surface of nitride liner 152 (on the poly node) is higher than STI top surface, but it is better if the poly-Si node 136' itself extends higher than the STI (156) encircling it.

FIG. 1N illustrates a next step (deposit STI oxide) of the process. STI oxide 156 is deposited, overfilling the trenches 146*a* and 146*b*, and then chemical-mechanical polishing (CMP) may be performed, stopping on the nitride liner 152 which serves as a CMP etch stop. Then the STI oxide 156 is etched back, such as 400-500 Å, such as during clean and etch processes. Four separate portions of STI oxide 156*a*, 156*b*, 156*c*, 156*d* are shown.

Note the following:
- the STI 156*b* and 156*c* forms a ring which surrounds a top portion of the overall node conductor (all of 136', as well as part of 134')
- the top surface of the poly-Si contact 136' (overall node conductor) is positioned (or extends) higher than a top surface of the surrounding STI oxide 156
- the nitride liner 152 is still in place, and is also higher than the STI oxide 156
- only the top portions of the nitride liner 152 are exposed, the side portions are covered by STI oxide 156.

FIG. 1O illustrates a next step (remove nitride liner) of the process. In this step, the exposed portions of the nitride liner 152 which are over the islands 102*a* and 102*c*, and over the poly-Si contact 136' may be removed, using hot Phosphorous selective to oxide. The nitride islands 106*a* and 106*c* are removed as well. (The remaining nitride liner, which is only on sidewalls and is not covering the top of anything, is labeled 152' (prime).)

Note that there are still remnants of the original oxide 104' over the silicon islands 102*a* and 102*c*, and there is still oxide liner 150*b* over the poly-Si contact 136'.

In FIG. 1O, the dashed line indicates that the top of the poly-Si contact 136' is higher than the top of the STI 156 (156*a,b,c,d*).

FIG. 1P illustrates a next step (clean oxide and form devices and contacts in Si active and trench capacitance areas) of the process. First, the remaining oxide 104' over the silicon islands 102*a* and 102*c* and oxide liner 150*b* over the poly contact 136' is removed.

The silicon island 102*a* can serves as an active area for forming a transistor 160. The transistor 160 need not be connected to the trench capacitor. (The trench capacitor, for example, may be used for power supply and not for DRAM.) Generally, the transistor 160 is included just for example to show that the trench capacitance process can be integrated with conventional (standard) CMOS processes.

An implant may be performed to create a conductive region 170 in the silicon island 102*c*, and extending laterally to contact (merge with) the buried plate 130', as illustrated. This will provide a contact to the buried plate 130' of the capacitor.

Silicide 162, 164, 166 may be formed, as shown, over the source, gate and drain regions of the transistor 160.

Silicide 172 may be formed atop the poly contact 136', and silicide 174 may be formed atop the island 102c for contact to the buried plate 130'. Here, as previously mentioned, if it had been difficult to remove the nitride liner 152 on the poly-Si contact 136', it would be difficult to form the silicide 172 on the poly-Si contact 136'.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a trench capacitor comprising:
   forming a trench in a silicon layer;
   forming a buried plate surrounding the trench;
   providing a dielectric layer lining the trench;
   providing a node conductor in the trench; and
   providing STI oxide completely surrounding and partially covering over a top portion of the node conductor;
   wherein, a top surface of the mode conductor extends higher than a top surface of the surrounding STI oxide; and
   providing a conducting region within the silicon region, wherein said conducting region contacts the buried plate, and also contacts an island of silicon disposed between two shallow trench isolation regions within the silicon layer.

2. The method of claim 1, including:
   extending the top surface of the node conductor 300-800 Å higher than a top surface of the silicon layer.
3. The method of claim 1, including:
   providing the silicon layer of bulk silicon.
4. The method of claim 1, including:
   providing the silicon layer of a silicon on insulator (SOI) substrate.
5. The method of claim 1, further including:
   disposing a nitride liner atop the node conductor, serving as a CMP etch stop.
6. A method of forming a trench capacitor comprising:
   providing a silicon layer;
   providing a first oxide layer on the silicon layer;
   providing a nitride layer on the first oxide layer;
   forming a deep trench extending through the nitride layer, through the first oxide layer, and into the silicon layer;
   providing a buried plate (BP) surrounding the deep trench;
   providing a dielectric material lining sidewalls and a bottom surface of the deep trench; and
   depositing a conductive poly node in the trench;
   providing STI oxide completely surrounding and partially covering over a top portion of the conductive poly node in the deep trench;
   wherein, a top portion of the conductive poly node is etched back after deposition to be above a top surface of the silicon layer and below a top surface of the first nitride layer; and
   extending the top surface of the conductive poly node 300-800 Å higher than the top surface of the silicon layer; and
   providing a conducting region within the silicon region, wherein said conducting region contacts the buried plate, and also contacts an island of silicon disposed between two shallow trench isolation regions within the silicon layer.
7. The method of claim 6, including:
   providing the nitride layer with a thickness of 80-150 nm.
8. The method of claim 6, including:
   forming the trench by reactive ion etching (RIE).
9. The method of claim 6, including:
   extending the top surface of the poly node 500 Å higher than the top surface of the silicon layer.

* * * * *